United States Patent [19]

Noro

[11] Patent Number: 4,891,644
[45] Date of Patent: Jan. 2, 1990

[54] DEVICE FOR DETERMINING PICK-UP HEAD TRACKING ERROR IN A DIGITAL TAPE PLAYER

[75] Inventor: Masao Noro, Hamamatsu, Japan

[73] Assignee: Yamaha Corporation, Hamamatsu, Japan

[21] Appl. No.: 207,882

[22] Filed: Jun. 10, 1988

Related U.S. Application Data

[63] Continuation of Ser. No. 1,877, Jan. 8, 1987, abandoned.

[30] Foreign Application Priority Data

Jan. 14, 1986 [JP] Japan .................................. 61-6081

[51] Int. Cl.[4] ........................ H03M 1/52; G11B 21/10
[52] U.S. Cl. ................................ 341/128; 360/77.01; 369/47
[58] Field of Search ..................... 341/132, 157, 164; 360/52, 55, 65, 69, 70, 74.4, 75, 76, 77; 369/47

[56] References Cited

U.S. PATENT DOCUMENTS 3,849,775 11/1974 Buchanan et al. ........... 340/347 NT

Primary Examiner—William M. Shoop, Jr.
Assistant Examiner—Marc S. Hoff
Attorney, Agent, or Firm—Spensley, Horn Jubas & Lubitz

[57] ABSTRACT

An analog-to-digital converter suitable for digitalizing signals used in an automatic track finding mechanism of a digital audio tape-recorder. The A/D converter comprises a sampling clock generation circuit for generating a sample clock in synchronism with an input signal and an analog-to-digital conversion circuit for analog-to-digital converting an amplitude peak value of the input signal at a timing of the sampling clock. The A/D converter is samplified in structure, for the sampling clock for sample holding does not have to be quartz oscillated but only needs to be a signal synchronous to the input signals.

6 Claims, 6 Drawing Sheets

DEVICE FOR DETERMINING PICK-UP HEAD TRACKING ERROR IN A DIGITAL TAPE PLAYER

This is a continuation of Ser. No. 001,817, filed 1/8/87, now abandoned.

BACKGROUND OF THE INVENTION

This invention relates to an analog-to-digital converter (hereinafter referred to as an A/D converter) which is used, for example, for digitalizing signals in ATF (automatic track finding mechanism) of a DAT (digital audio tape-recorder), and more particularly to an A/D converter which is simplified in structure compared to conventional converters of the similar type.

The ATF mechanism of DAT is generally used to guide a head so that the head can always trace an intended track. Utilizing the fact that while a head is tracing a predetermined track appropriately, crosstalks from adjacent tracks on both sides become identical in amount, the running speed of a tape is controlled to adjust the positional relation between the head and tracks. The structure of the mechanism in R-DAT (DAT of rotary head type) is different from that in an 8-mm PCM DAT.

(1) R-DAT

FIG. 1 shows a conventional ATF circuit for R-DAT.

In the figure, tracks of a tape 10 are recorded with pilot signals $f_1$, $f_2$ (or $f_3$) for ATF control. The signals $f_1$, $f_2$, and $f_3$ have the respective frequencies 130 kHz, 522 kHz and 784 kHz.

If it is assumed that a head 12 is tracing a track $T_2$, the head 12 produces not only reproduced signals from the track $T_2$ but also signals from adjacent tracks $T_l$ and $T_3$ due to crosstalk. If the head 12 is appropriately tracing the track $T_2$, the amounts of the crosstalk from the tracks $T_1$ and $T_3$ are equal to each other, but if the head deviates to either direction from the track $T_2$, the amounts will differ from each other. Pilot signals $f_2$ and $f_3$ are recorded alternately in respective tracks. Based on the timing of detection of the pilot signals $f_2$ or $f_3$ on the track $T_2$, the amplitude levels of the pilot signals $f_1$ on both tracks $T_1$ and $T_3$ are detected to thereby learn amounts of crosstalk from adjacent tracks $T_1$ and $T_3$ on both sides. If the adjacent tracks are identified by applying the symbols + or − to respective sides in respect of the head 12, the difference in amount between the crosstalks can indicate deviation from a particular track.

In the ATF circuit shown in FIG. 1, the reproduced signals from the head 12 are applied to an amplifier 14, the pilot signal $f_1$ is extracted by a low-pass filter 16, and an envelope thereof is detected by an envelope detector 18. A band-pass filter 23 and a $f_2$ detection circuit 25 detects the pilot signals $f_2$ and $f_3$ and produces signals indicating sections of these pilot signals.

A timing circuit 27 outputs sample holding signals $SP_1$ and $SP_2$ based upon the timing of either $f_2$ or $f_3$ which has been detected. The sample holding signal $SP_1$ is produced at a timing immediately after the detection of pilot signals $f_2$ and $f_3$. With the sample holding signal, the outputs from the envelope detector 18 are sample-held to thereby sample-hold at the sample holding circuit 29 the amplitude level of the pilot signal $f_1$ on the track $T_1$ which is one track previous to the currently tracing track $T_2$. The sample holding signal $SP_2$ is produced at a timing after a predetermined period of time following the detection of the pilot signals $f_2$ or $f_3$ (or the timing of the pilot signal $f_1$ of the track $T_3$). With the sample holding signal, the output from the envelope detector 18 is sample-held to thereby sample-hold at a sample holding circuit 31 the amplitude level of the pilot signal $f_1$ of the track $T_3$. A subtractor 33 makes substraction between the outputs from the sample holding circuits 29 and 31 and detects the defference in amplitude level of the pilot signal $f_1$ between the tracks $T_1$ and $T_3$.

The output from the subtractor 33 is provided as a tracking error signal to thereby control the speed of a capstan motor 36 via a driving amplifier 34. This controls the running speed of the tape 10 to correct tracking errors.

Alternatively, the ATF circuit may be constructed as shown in FIG. 2. Like reference numerals are used to designate like parts in FIG. 1.

The pilot signal fl is extracted by a low-pass filter 16, and an envelope thereof is detected by an envelope detector 18. A synchronized signal generator 19 comprising an equalizer 20 and a comparator 22 detects the pilot signals $f_2$ and $f_3$ and produces signals indicating sections of these pilot signals.

A logic circuit 24 outputs sample holding signals $SP_1$ and $SP_2$ based upon the timing of either $f_2$ or $f_3$ which has been detected. A signal DRUMPG which indicates the phase of rotation of a head cylinder as well as a muting control signal MUTE are separately applied to the logic circuit 24, too. The sample holding signal SP1 is produced at a timing immediately after the detection of pilot signals $f_2$ and $f_3$. With the sample holding signal, the outputs from the envelope detector 18 are sample-held to thereby sample-hold at the sample holding circuit 26 the amplitude level of the pilot signal $f_1$ on the track $T_1$ which is one track previous to the currently tracing track $T_2$. A subtractor 28 subtracts the output from the sample holding circuit 26 out of the output from the envelope detector 18. The sample holding signal SP2 is produced at a timing after a predetermined period of time following the detection of the pilot signals $f_2$ or $f_3$ (or the timing of the pilot signal $f_1$ of the track $T_3$). With the sample holding signal, the output from the subtractor 28 is sample-held to thereby sample-hold at a sample holding circuit 30 the difference in amplitude level of the pilot signal $f_1$ between the tracks $T_1$ and $T_3$.

The output from the sample holding circuit 30 is provided as a tracking error signal to thereby control the speed of a capstan motor 36 via a driving amplifier 34. This controls the running speed of the tape 10 to correct tracking errors.

(2) 8-mm PCM DAT

As shown in FIG. 3, four types of pilot signals $F_1$, $F_2$, $F_3$, and $F_4$ are recorded in each track of a tape 36 by superposing them on audio signals. A head 38 is controlled in tracking by reading out the crosstalk of the pilot signals between adjacent tracks $T_1$ and $T_3$ and the currently reproducing track $T_2$ with the head 38 at the time of reproduction. More specifically, the output from the reproducing head 38 via an amplifier 39 is mixed with a pilot signal $F_2$ (i.e. the pilot signal of the currently reproducing track $T_2$) by a mixer 40. A band-pass filter 42 extracts the content equivalent to the difference in frequency between the pilot signals $F_1$ and $F_2$ (or the crosstalk content from the track $T_1$) out of the outputs from the mixer 40. A band-pass filter 44 extracts the content equivalent to the difference in frequency between the pilot signals $F_2$ and $F_3$ (or the crosstalk content from the track $T_3$) out of the outputs from the mixer 40. A subtractor 46 calculates the difference between above two crosstalk contents and uses the difference as tracking error signals in controlling the speed of a capstan motor (not shown) to thereby correct tracking errors.

There is a synchronized signal generator ciruit 19 shown in FIGS. 1 and 2 which has already been digitalized, but processing of ATF signals per se is still conventionally conducted in analog (the section 21 encircled with a-dot-and-chain line in FIGS. 1 and 2). The analog circuits, however, need a large number of components and have factors to deteriorate precision such as data missing or mixture of noises during the processing. The circuit shown in FIG. 3 is not free from such problems either.

Although ATF signal processing generally comprises holding of data and adding/subtracting which can be easily processed in digital, A/D conversion of the input signals of the circuit 21 or ATF signals inevitably pushes up cost as it requires additional circuits.

As the data necessary for ATF signal processing is the peak value of amplitude rather than signals per se, ATF signals do not have to be converted from analog to digital as they are.

This invention was contrived to eliminate aforementioned problems encountered in the prior art and aims at providing an A/D converter which is easily used for A/D converting ATF signals for digitalization of the ATF signal processing.

SUMMARY OF THE INVENTION

The A/D converter according to the invention generates sampling clocks in synchronism with input signals and converts the peak value of amplitude of the input signal from analog to digital at the timing of the sampling clock.

The A/D converter according to the invention is characterized in that it comprises sampling clock generation means for generating a sampling clock in synchronism with an input signal and analog-to-digital conversion means for analog-to-digital converting an amplitude peak value of the input signal at a timing of the sampling clock.

In one aspect of the invention, the sampling clock generation means comprises a comparator for comparing the level of the input signal with 0 level for detecting and outputting a positive level section of the input signal as the sampling clock.

In another aspect of the invention, the analog-to-digital conversion means comprises a capacitor receiving the input signal, means for charging the capacitor at a timing of the sampling clock and discharging the capacitor during absence of the sampling clock, detection means receiving an output voltage of the capacitor for detecting and outputting a signal representing a positive voltage section thereof, amplitude peak value signal generation means receiving the signal from the detection means and the sampling clock for producing an amplitude peak value signal whose pulse width corresponds to the amplitude peak value of the input signal, clock generation means responsive to the amplitude peak value signal for generating clocks during presence of the amplitude peak value signal, and counter means for counting the output clocks of the clock generation means.

The A/D converter can be made simple in structure because the sampling clock for sample holding does not have to be quartz oscillated as in the case of conventional A/D conversion but only needs to be a signal synchronous to input signals. The speed in conversion does nor have to be high either, as it involves only the peak values in amplitude. It therefore does not require high speed elements to realize the invention. If the A/D converter is applied to ATF signal processing, it can eliminate envelope detection of pilot signals to thereby reduce the number of necessary components as well as to prevent deterioration in precision which might otherwise be caused by missing data or noise mixture.

BRIEF DESCRIPTION OF THE DRAWINGS

In the accompanying drawings.

DESCRIPTION OF PREFERRED EMBODIMENTS

Figure 4:
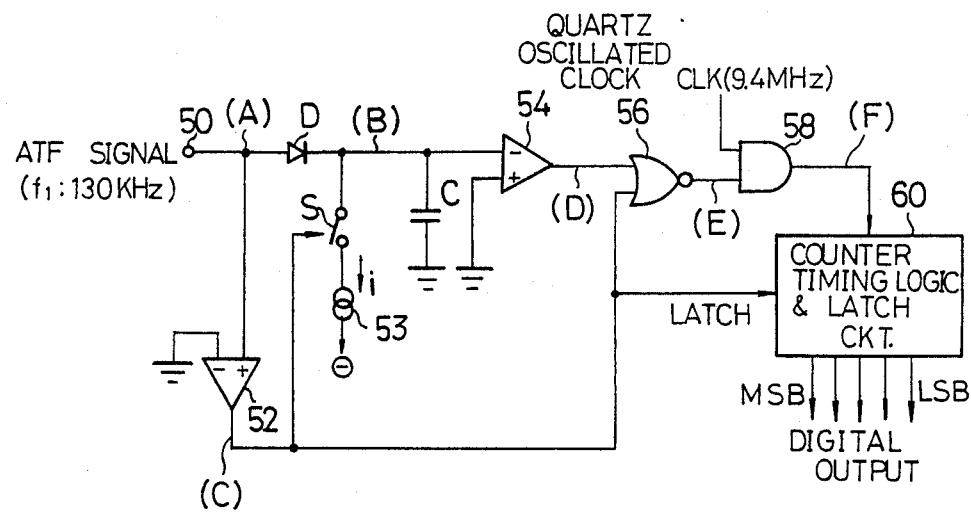
FIG. 4 is a circuit diagram showing an embodiment of this invention.

An embodiment of this invention is shown in FIG. 4. Description will be given to the case where this invention is applied to the A/D conversion of the amplitude peak values of ATF signals in R - DAT system.

Figure 1:
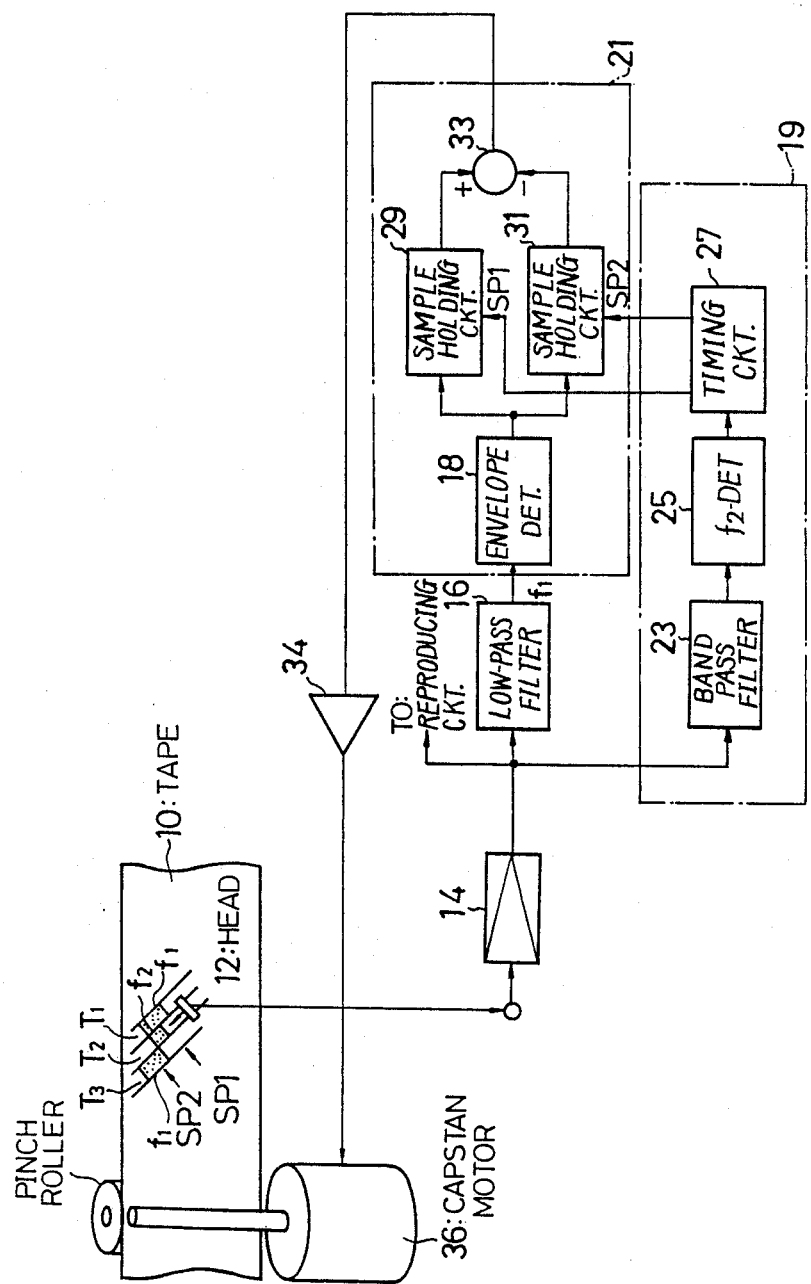
FIG. 1 is a block diagram showing a conventional ATF circuit in an R-DAT system.
Figure 2:
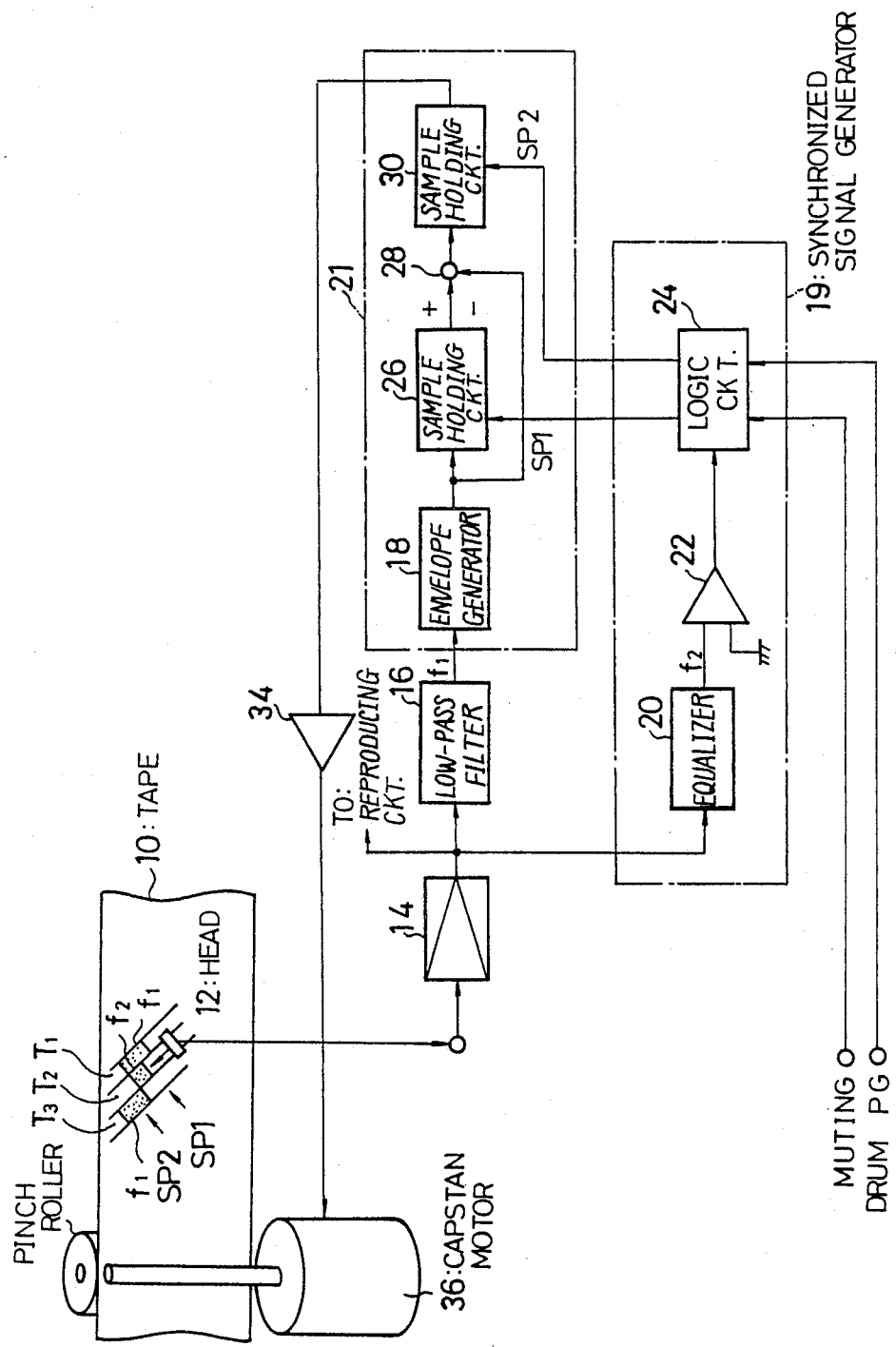
FIG. 2 is a block diagram showing an assumed another ATF circuit in an R-DAT system.
Figure 3:
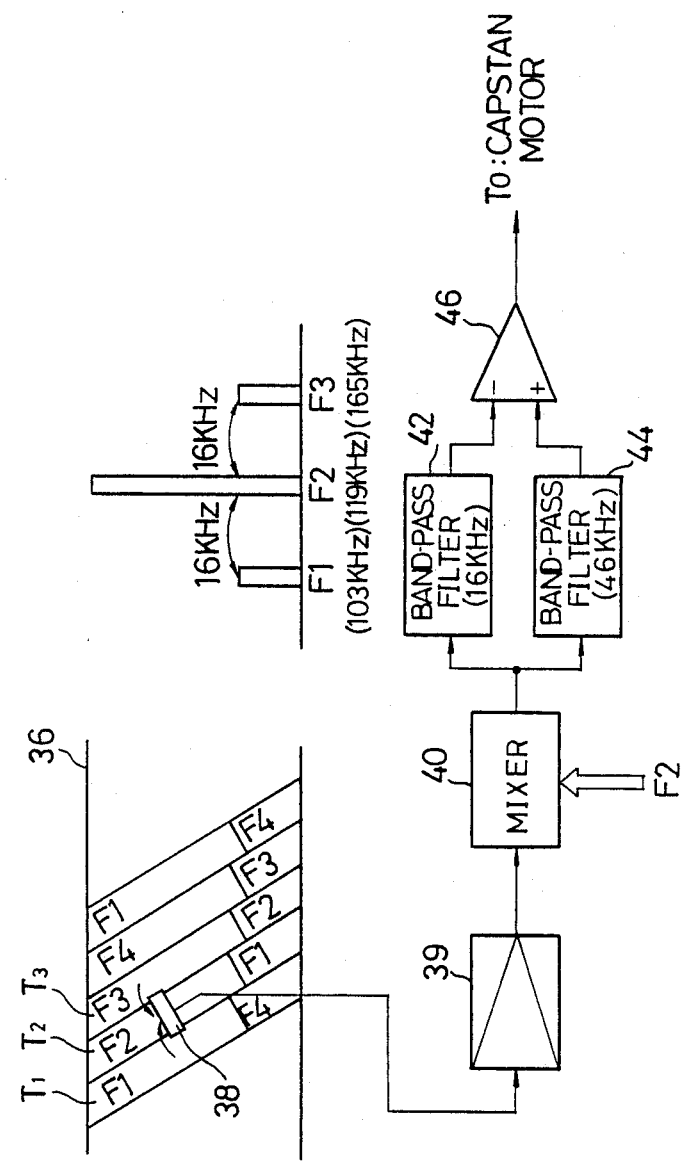
FIG. 3 is a block diagram showing a conventional ATF circuit in an 8-mm video PCM.

In FIG. 4, a crosstalk content of the pilot signal from a track adjacent to a reproducing track (e.g. the pilot signal $f_1$ shown in FIG. 1) is applied from an input terminal 50 as an ATF signal. The input signal is compared with 0 level by a comparator 52 to detect a positive section of the signal waveform. The output from the comparator 52 is used as a sampling clock.

The input signal is half-wave rectified by a diode D to charge a capacitor C. The discharge current circuit of the capacitor C comprises a switch S and a constant-current regulated power 53. When the output from the comparator 52 is "H", i.e. a positive half cycle of the input signal, the switch S is OFF to charge the capacitor C with the half-wave rectified output from the diode D. When the output from the comparator 52 is "L", i.e., a negative half cycle of the input signal, the switch S is ON to discharge the capacitor C in a constant current i. The comparator 54 receives as an input the electric voltage from the capacitor C to detect sections which are positive.

A NOR circuit 56 receives as inputs the outputs from the comparators 52, 54 and outputs "H" if both inputs are "L". The section of "H" varies depending on the amplitude peak values of input ATF signals.

An AND circuit 58 receives as inputs the outputs from the NOR circuit 56 and quartz oscillated clocks CLK (in the case of R-DAT, 9.4 MHz, for example) and outputs clock CLK during the section of "H".

A counter timing logic and latch circuit 60 counts the clocks CLK from the AND circuit 58 and latches the last count at the rise of the next output from the comparator 52. As the section "H" of the NOR circuit 56 varies depending on the amplitude peak values of ATF signals, the last count corresponds to the peak value in amplitude of ATF signals. In this manner, the amplitude peak values of the input ATF signals are converted from analog to digital.

Figure 5:
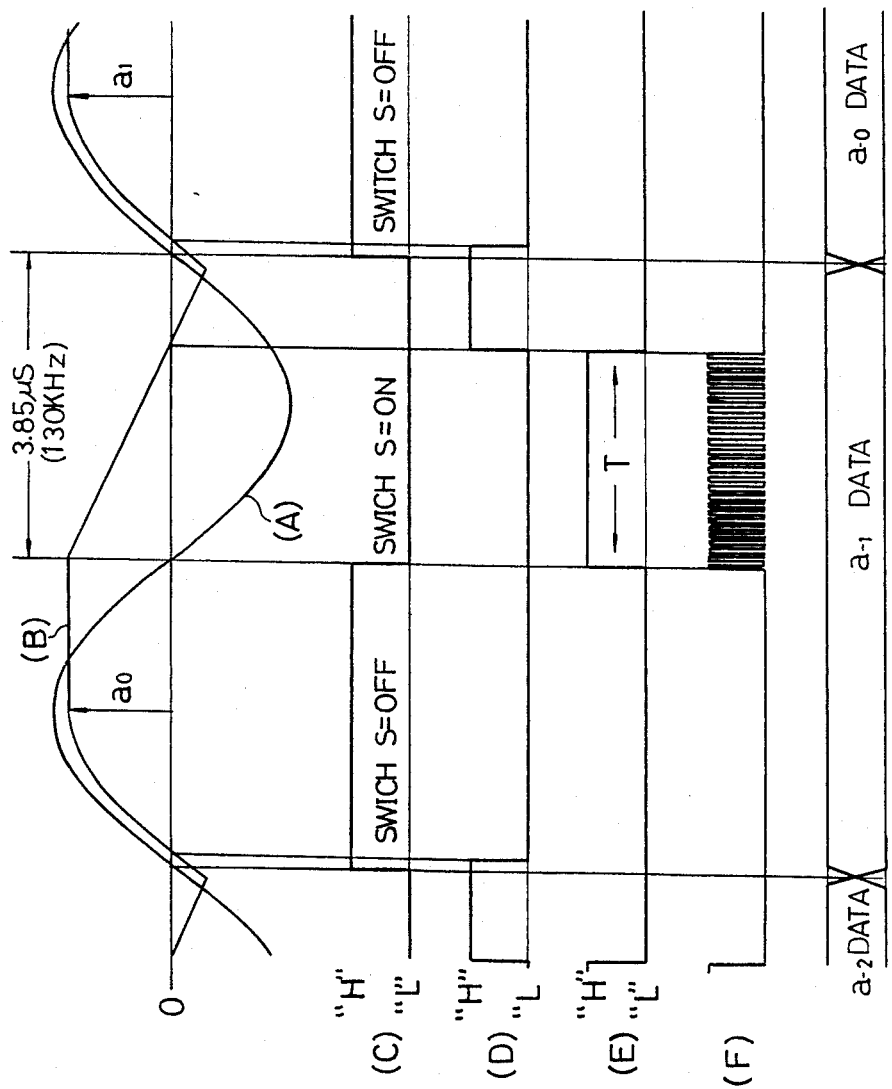
FIG. 5 is a waveform chart of the operation of the embodiment shown in FIG. 4.

FIG. 5 shows the waveforms of the operation in sections (A) through (F) in FIG. 4. The operation will now be described referring to the chart.

In the positive half cycle of an input ATF signal (A), the output (C) of the comparator 52 is "H" and the switch S is in an OFF state. The capacitor C is charged with the input ATF signal provided from the diode D until it reaches the peak value $a_0$ of the amplitude of the input ATF signal and the value is held (B).

In the negative half cycle of the input ATF signal (A), the output (C) from the comparator 52 is "L" which is used as a sampling clock to enable the switch S. As the diode D is disabled currently, the charge of the capacitor C is discharged in a constant current i from the switch S via the constant-current regulated power 53 (B).

The comparator 54 outputs "H" for the sections where the voltage across the capacitor C are negative (D). As the capacitor C is discharged in a constant current i, the voltage across the capacitor C crosses 0[Volt]after the time of period $T=C \cdot a_0/i$. Therefore the larger the peak hold value is, the shorter becomes the duration of "H" at the comparator 54. Conversely the smaller the peak hold value is, the longer becomes the "H".

The NOR circuit 56 receives as inputs the outputs from the comparators 52, 54. During the period where both inputs are "L", i.e. period T from the time the capacitor starts discharge until the time the voltage thereof crosses the 0 level, "H" is produced at the output of NOR circuit 56. By adjusting the capacitance of the capacitor C and the value of the discharge current i to make the value T shorter than a half cycle of an input ATF signal, the time T in proportion to the amplitude peak value $a_0$ of the input ATF signal can be obtained (E).

A PNM (pulse number modulation) signal can be obtained by ANDing the output of the NOR circuit 56 and the quartz oscillated clock CKL by the AND circuit 58 and the amplitude peak value $a_0$ can be converted into digital. The counter timing logic and latch circuit 60 counts and outputs the PNM signals. The above operation is executed for each cycle of input ATF signals to convert the amplitude peak values of respective cycles from analog to digital.

In the case of R - DAT system, the ATF signals are of the frequency of 130 KHz, and the digital output of 5 bits can be obtained if 9.4 MHz is used as the rate of the quartz oscillated clock. Tracking error signals can be obtained by holding a singular or a plurality of digital data corresponding to each sampling and processing.

Compared to the conventional A/D converter for peak values in analog signals where one waveform of an analog signal is sampled minutely with high sampling frequency to A/D convert each sampled value, the sampled values are stored consecutively in a memory and the largest sampled value is detected by a comparator, the embodiment of this invention shown in FIG. 4 is simpler in structure as it only needs one sampling and one A/D conversion for one waveform and besides memories and comparators are not required.

Figure 6:
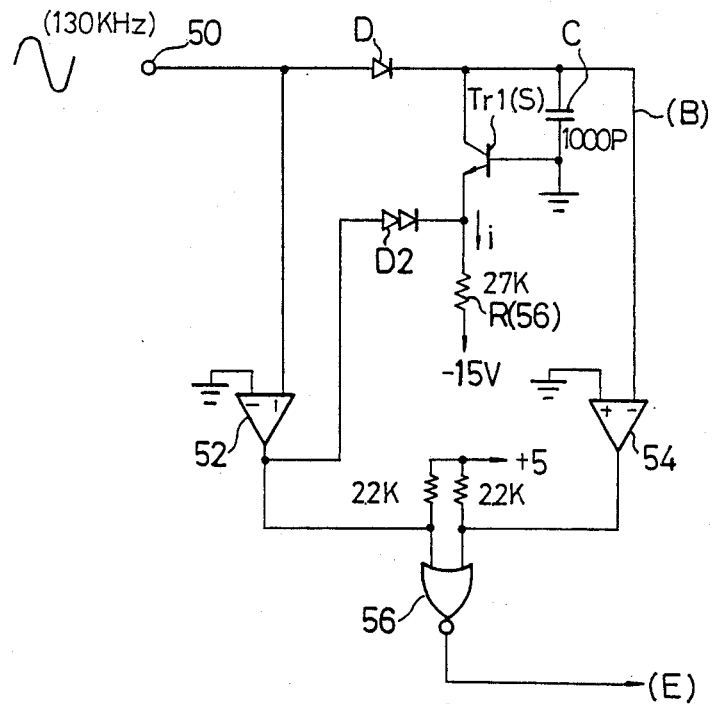
FIG. 6 is a circuit diagram showing an experimental circuit of the embodiment shown in FIG. 4.

FIG. 6 shows an experimental circuit of the embodiment shown in FIG. 4.

A transistor Tr 1 forms a switch S and a resistor R connected to −15 V forms a constant-current regulated power 56.

During the positive half cycle of an input ATF signal (e.g. a sign wave of 130 KHz is used as $f_1$), the output from the comparator 52 is at "H" to disable the transistor Tr 1 via the diode $D_2$ and charge the capacitor C with the input ATF signal. During the negative half cycle, the output from the comparator 52 is at "L" to enable the transistor Tr 1 to discharge the charge of the capacitor C from the transistor Tr 1 via the resistor R.

Figure 7:
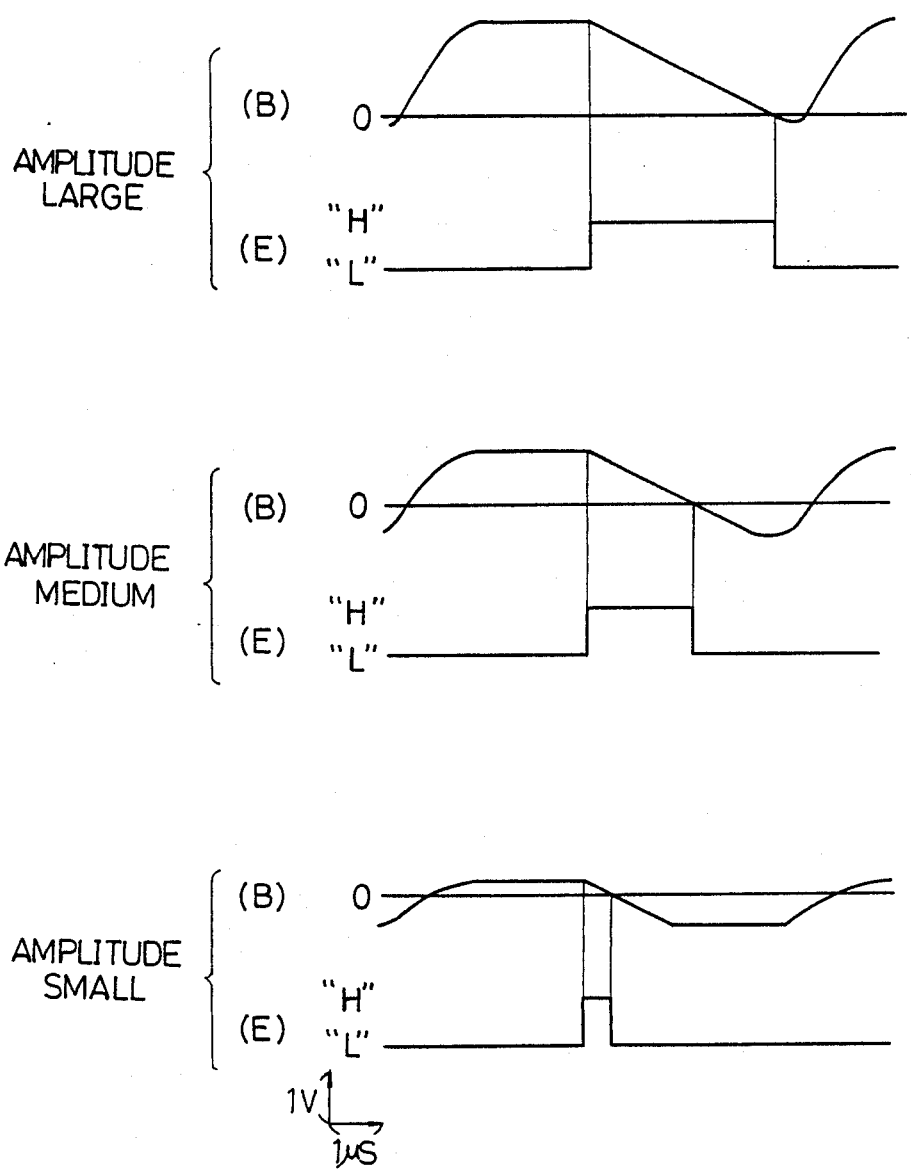
FIG. 7 is a waveform chart of the operation of the circuit shown in FIG. 6.

The operation of the experimental circuit shown in FIG. 6 is shown in FIG. 7. In the figure, the pulse width of the output from the NOR circuit 56 varies corresponding to the amplitude peak values of input signals to achieve expected result.

This embodiment is shown for application of this invention for ATF signal processing in R-DAT system, but this invention can be applied to other types of DAT of 8 mm video PCM and various usages which need A/D conversion of amplitude peak values other than DAT.

As stated in the foregoing, this invention can simplify the structure of A/D converter as sampling clocks for sample-holding do not need frequency-divided clocks of quartz oscillated signals which are required in the prior art A/D converter but only need signals synchronous to input signals. As the A/D conversion of the invention involves the amplitude peak values alone, it can be conducted at a slower speed without the necessity of high speed elements.

As shown in embodiments, if the converter of the invention is applied to ATF signal processing for R-DAT system, for the reason that it does not need envelope detection of pilot signals, the number of components can be reduced as compared to the prior art, and deterioration of precision which might otherwise be caused by missing data or noise mixture can be avoided.

What is claimed is:

1. A device for determining pick-up head tracking error in a digital tape player which uses tape having plural parallel tracks recorded diagonally across the tape comprising:
   a pick-up head for reading from the tape a pilot signal of multiple cycles;
   conversion means for sampling the pilot signal during each cycle thereof to obtain a single analog signal proportional to the peak value of each cycle of the pilot signal and for converting each analog signal to a digital signal representative of each peak value;
   sampling clock generation means for generating a sampling clock in synchronism with the pilot signal to control the timing of the sampling of the pilot signal by the conversion means; and
   means of determining pick-up head tracking error based on the digital signal.

2. A device as defined in claim 1 wherein said sampling clock generation means comprises a comparator for comparing the level of each cycle of the pilot signal with 0 level for detecting and outputting a positive level section of each cycle of the pilot signal as said sampling clock.

3. A device as defined in claim 1 wherein said conversion means comprises:
   a capacitor receiving the pilot signal;

means for charging said capacitor at a timing of the sampling clock and discharging said capacitor during absence of the sampling clock during each cycle of the pilot signal;

detection means receiving an output voltage of said capacitor for detecting and outputting a signal representing a positive voltage section thereof;

peak value signal generation means receiving the signal from said detection means and the sampling clock for producing an peak value signal whose pulse width corresponds to the peak value of the cycle of the pilot signal being sampled by the conversion means;

clock generation means responsive to the peak value signal for generating clocks during presence of the peak value signal; and counter means for counting the output clocks of said clock generation means.

4. A device as defined in claim 1 wherein the conversion means comprises:

charging means for storing electric charge in response to the pilot signal;

discharge means for electrically discharging the charging means wherein the charging means and discharging means operates in each cycle in synchronism with the sampling clock and wherein the charge stored by the charging means before discharge in each cycle is proportional to the peak value of the respective cycle; and clock means for determining the duration of the discharge and producing a digital output representing the peak value of each cycle of the pilot signal.

5. A device for determining pick-up head tracking error in a digital tape player which uses tape having plural parallel tracks recorded thereon comprising:

a pick-up head for reading pilot signals, each having multiple cycles, from adjacent tracks;

conversion means for sampling the pilot signals during each cycle thereof to convert selectively the peak value of each cycle from analog to digital form;

timing means for synchronizing with the pilot signal the sampling of the pilot signal by the conversion means; and means for determining pick-up head tracking error based on the digital form of the peak values corresponding to pilot signals read from the adjacent tracks.

6. A device for determining pick-up head tracking error in a digital tape player which uses tape having plural parallel tracks recorded thereon comprising:

a pick-up head for reading a pilot signal from a track;

conversion means for sampling the pilot signal to identify the peak value of each cycle of the pilot signal and for converting only the peak value of the pilot signal from analog to digital form;

timing means for synchronizing the sampling of the pilot signal by the conversion means with the pilot signal; and means for determining pick-up head tracking error based on the digital form of the peak value.

* * * * *